United States Patent [19]

Chu et al.

[11] 4,055,424
[45] Oct. 25, 1977

[54] NOVEL MICROFILM AND PROCESS FOR PREPARATION

[75] Inventors: Joseph Yung-Chang Chu, Fairport; Richard Louis Schank, Webster, both of N.Y.

[73] Assignee: Xerox Corporation, Stamford, Conn.

[21] Appl. No.: 684,323

[22] Filed: May 7, 1976

[51] Int. Cl.$^2$ .............................................. G03C 1/71
[52] U.S. Cl. .................................... 96/35.1; 96/68; 96/87 R; 96/115 R
[58] Field of Search ............... 96/35.1, 86 P, 87 R, 96/115 R, 115 P, 68, 69, 33; 427/333, 400, 53, 54, 43

[56] References Cited

U.S. PATENT DOCUMENTS

| | | | |
|---|---|---|---|
| 3,157,505 | 11/1964 | Notley | 96/68 |
| 3,615,435 | 10/1971 | Chu et al. | 96/68 |
| 3,865,588 | 2/1975 | Ohto et al. | 96/35.1 |
| 3,886,865 | 6/1975 | Ohto et al. | 96/35.1 |

*Primary Examiner*—John D. Welsh
*Attorney, Agent, or Firm*—James J. Ralabate; James P. O'Sullivan; Donald M. MacKay

[57] ABSTRACT

Microfilm structures of improved contrast are provided by coating a suitable transparent film substrate with an intermediate layer of a silicone elastomer which is abhesive to ink, coating said silicone with a surface layer of a photosensitive polymer which when exposed to activating electromagnetic radiation cross-links and chemically attaches to said silicone elastomer to form oleophilic ink accepting image areas, imagewise exposing said photosensitive polymer, removing the non-exposed, light sensitive polymer to form non-imaged areas of the abhesive silicone elastomer, and selectively inking the oleophilic image areas to form an imaged microfilm structure of improved image density and contrast.

10 Claims, 5 Drawing Figures

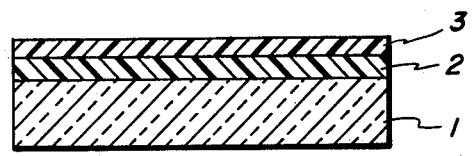
FIG.1
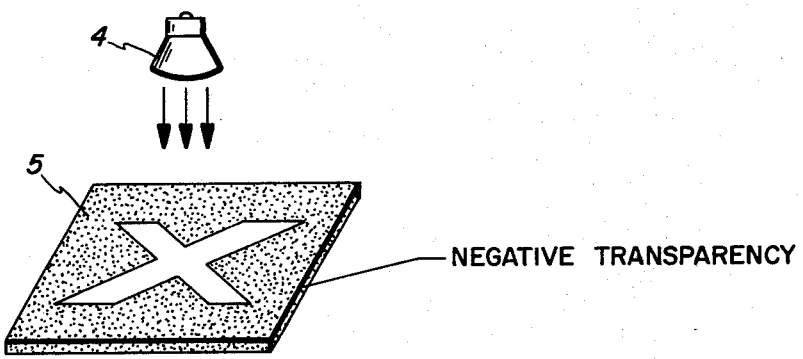
FIG.2a — NEGATIVE TRANSPARENCY
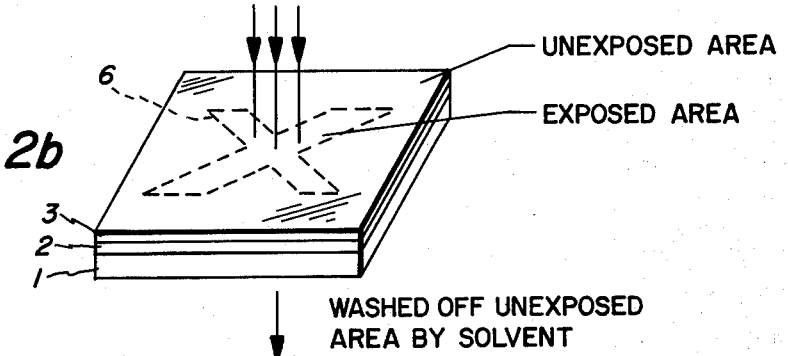
FIG.2b
— UNEXPOSED AREA
— EXPOSED AREA
WASHED OFF UNEXPOSED AREA BY SOLVENT
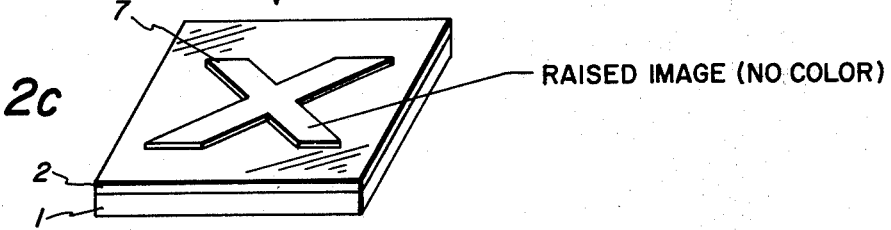
FIG.2c — RAISED IMAGE (NO COLOR)
APPLY INK
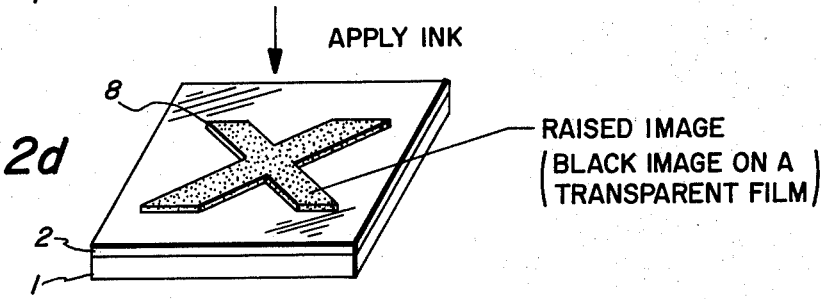
FIG.2d — RAISED IMAGE (BLACK IMAGE ON A TRANSPARENT FILM)

NOVEL MICROFILM AND PROCESS FOR PREPARATION

BACKGROUND OF THE INVENTION

This invention relates to novel microfilm and to a method of preparation which has improved contrast and which is more easily made than microfilm heretofore.

In the preparation of microfilm, it has become the practice to employ a photopolymer with groups that can be dyed and these groups treated in various ways to render them visible. Thus, the preparation and development of the microfilm was often difficult, time consuming and expensive. In accordance with the invention, however, microfilm structures are provided which do not require special dye forming photopolymer groups and further which can be easily treated to form images of high density and excellent contrast.

BRIEF DESCRIPTION OF THE INVENTION

In accordance with the invention a novel microfilm of improved density and contrast is provided by coating a suitable transparent film substrate with an abhesive silicone elastomer and coating the elastomer with a surface layer of a photosensitive polymer which when exposed to actinic radiation (activating electromagnetic radiation) crosslinks and combines with said silicone elastomer to form oleophilic ink accepting image areas. When it is desired to image the microfilm, the photosensitive polymer is exposed to actinic radiation so as to insolubilize and crosslink the polymer in the image areas to form an ink accepting image area. The non-exposed light sensitive polymer is then removed to form non-imaged areas of the abhesive silicone elastomer and the microfilm is selectively inked in the oleophilic image areas to form an imaged microfilm structure of improved image density and contrast.

BRIEF DESCRIPTION OF THE DRAWINGS

FIG. 1 is a side view of the novel microfilm showing the separate layers.

FIG. 2 is a schematic illustration of the imaging process for the microfilm.

DETAILED DESCRIPTION OF THE INVENTION

Referring to FIG. 1, silicone elastomer 2 is shown sandwiched between transparent substrate 1 and photosensitive polymer 3. Suitable transparent substrates include polyesters such as Mylar, polyacetal, polyethylene and other film forming polymers or even glass can be employed.

Silicone elastomers which can be employed include silicone homopolymers and silicone copolymers having a non-silicone phase. Suitable silicones are those employed heretofore in waterless lithography which have reactive crosslinking sites or are capable of being cured to an ink releasable elastomeric condition. Exemplary of suitable silicone gums are those having only methyl containing groups in the polymer chain such as poly(dimethylsiloxane); gums having both methyl and phenyl containing groups in the polymer chain, as well as gums having both methyl and vinyl groups, methyl and fluorine groups or methyl, phenyl and vinyl groups in the polymer chain. Typical pendant groups through which crosslinking can occur include vinyl, hydroxyl, amino, isocyanate and thioisocyanate.

Multiblock or polyblock silicone polymers which can be employed comprise silicone segments as hereinabove described and non-silicone segments. Typical non-silicone segments include polystyrene, poly(alphamethystyrene), poly(N-vinyl-carbazole), polycarbonate and polysulfone resins such as defined in U.S. Pat. Nos. 3,408,186 and 3,408,190 which are herein incorporated by reference. The particular non-silicone segments are not critical, it only being necessary that the segments be non-compatible and exhibit a glass transition temperature above ambient temperature which will be encountered in use. Preferably, the polyblock polymers are of the $(AB)_n$ type. A representative method of preparation involves the addition of a siloxane to a "living" polymer (prepared by unterminated anionic polymerization techniques); J. C. Saam et al, *Properties of Polystyrene - Polydimethylsiloxane Block Copolymers*, I and ECProd Res. and DEV. 10 (March 1971); F. W. Billmeyer, *Textbook of Polymer Science*, 2nd edition, chapters 10 and 11, Wiley-Interscience Publishers, (1971) and Associated Bibliographies; and U.S. Pat. No. 3,665,052 — which are hereby incorporated by reference. The addition of the siloxane to the still active polymer leads to the formation of block copolymers which are substantially free from contamination by homopolymer fractions. The relative weight ratio of non-silicone segments to silicone segments in the block copolymers can range from 5:95 to 75:25 and preferably from 10:90 to 50:50.

The relative concentration and physical properties of the individual segments of the multiblock copolymer is preferably controlled so as to insure that the resulting copolymer is a heterophase elastomeric material having little if any chemical crosslinking of the copolymer chain.

Photosensitive polymers which can be employed need only be sensitive to actinic radiation and capable of polymerizing and combining with the silicone. Because dye groups are not necessary, the number of photosensitive polymers which can be employed is considerably expanded over that permitted for previous microfilm. An example is Photozid which is a linear macromolecule of an average molecular weight of approximately 500,000 formed by reacting a malaic anhydride vinyl ether copolymer with a light-sensitive hydroxy terminated arenesulfonyl azide and which is manufactured by the Upjohn Company. Its chemical name is poly[1-($\beta$-oxyethyl-4'-sulfonylazido-carbanilate)-carbonyl-2-hydroxycarbonyl-3-methoxycarbonyl-4-tetramethylene]. Polymers which insolubilize or polymerize when exposed to actnic radiation such as light are generally characterized by having azido groups which liberate gaseous nitrogen to form reactive nitrene intermediates. The nitrene intermediates can undergo a variety of insertion, addition and substitution reactions depending upon the structure and reaction conditions. Typical materials, however, are well known to the art and are described in U.S. Pat. Nos. 2,695,846; 3,002,003; 3,096,311 and the like.

Referring now to FIG. 2, light 4 is passed through negative transparency 5 in an image configuration to polymerize and insolubilize the photopolymer in image area 6 as shown in FIG. 2b. The unexposed photosensitive polymer is then removed to provide a raised image at 7 as shown in FIG. 2c. Ink is then selectively applied to the image area 8 as shown in FIG. 2d and the microfilm is ready for use.

A variety of oleophilic inks can be employed to ink the microfilm and since the background is formed of an abhesive ink releasing surface, the ink adheres only to the image areas.

The unexposed photopolymer can be removed by a number of commonly employed solvents it only being necessary that the solvents selected will not dissolve the cured image portion.

The following examples will serve to illustrate the invention and preferred embodiments. All parts and percentages in said example and elsewhere in the specification and claims are by weight unless otherwise specified.

EXAMPLE I

A microfilm structure as illustrated in FIG. 1 was prepared by the following method. A solution of 10% dimethylpolysiloxane in benzene was used to coat a transparent Mylar substrate using a Gardner mechanical drive film coating apparatus equipped with a 4 mil gap applicator bar. The coating layer was dried and cured for 5 minutes at 150° C in an air circulating oven. The silicone elastomer coated film was then overcoated with a solution of 10% Photozid in acetone by using a 1 mil applicator bar. The coated film was dried in a vacuum oven at room temperature for 12 hours. The dried film was the exposed through a negative transparency to a 100 watt mercury arc lamp at a distance of 5 inches for 2 minutes. The partially exposed film was then washed with acetone to remove the photozide from the unexposed areas to provide a raised image on the silicone elastomer. The film was then dried at room temperature and the image inked (Ronico #91779 rubber base ink) by passing an ink roller over the surface layer to provide a clear, sharp black image on a transparent background.

EXAMPLE II

Preparation of Poly[vinylbenzyl chloride-co-(p-sulfonylazidobenzoyloxymethyl) styrene]

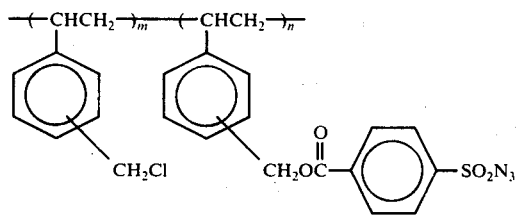

A solution of 1.00 gr. (0.0044 mole) of p-carboxy-benzenesulfonyl azide, 2.69 g. (0.0176 equiv.) of poly (vinyl-benzyl chloride), 0.32g (0.00500 mole) of 87% potassium hydroxide and 15 ml. of dimethylformamide was stirred for 70 hours at temperature of 25° C and poured into 25° C water. The product was precipitated from the water with tetrahydrofuran into 1% NaOH twice, into water twice, washed with water and methanol and dried in vacuuo. The copolymer consisted of about 10 mole percent of the sulfonylazido monomer.

EXAMPLE III

In accordance with the general procedure of Example I, the polymer of Example II was coated onto an elastomer coated film and the dried film exposed through a negative transparency for several minutes. After washing and inking, a clear, sharp image of excellent contrast was obtained.

Having described the present invention with reference to these specific embodiments, it is to be understood that numerous variations can be made without departing from the spirit of the invention and it is intended to encompass such reasonable variations or equivalents within its scope.

What is claimed is:

1. A novel microfilm comprising a transparent film substrate, an intermediate silicone elastomer which is abhesive to ink and a surface layer of a photosensitive polymer which upon exposure to activating electromagnetic radiation crosslinks and chemically attaches to the silicone elastomer to form ink accepting image areas.

2. The structure of claim 1 wherein the photosensitive polymer forms nitrenes upon exposure to activating electromagnetic radiation.

3. The structure of claim 1 wherein the abhesives silicone elastomer is formed of a polymer having a dimethylpolysiloxane backbone.

4. The structure of claim 1 wherein the surface layer is formed of poly[1-($\beta$-oxyethyl-4'-sulfonylzido-carbanilate)-carbonyl-2-hydroxycarbonyl-3-methoxycarbonyl-4-tetramethylene].

5. A process for providing a microfilm structure comprising:
   a. providing a suitable transparent film substrate,
   b. coating said substrate with an intermediate layer of a silicone elastomer gum curable or coalesceable to an ink releasing abhesive condition,
   c. rendering said silicone inherently abhesive to ink,
   d. coating said silicone with a surface layer of a photosensitive polymer which then exposed to actinic radiation crosslinks and combines with said silicone elastomer to form oleophilic ink accepting image areas,
   e. imagewise exposing said photosensitive polymer to cause the polymer to become insoluble and combine with the silicone to form an image area
   f. removing the non-exposed, light sensitive polymer to form non-imaged areas of the abhesive silicone elastomer, and
   g. selectively inking the oleophilic image areas to form an imaged microfilm structure of improved image density and contrast.

6. The structure of claim 5 wherein the abhesive silicone elastomer is formed of a polymer having a dimethylpolysiloxane backbone.

7. The structure of claim 5 wherein the surface layer is formed of poly[1-($\beta$oxyethyl-4'-sulfonylazido-carbanilate)-carbonyl-2-hydroxycarbonyl-3-methoxycarbonyl-4-tetramethylene].

8. An imaged microfilm comprising a transparent film substrate, an intermediate silicone elastomer which is adhesive to ink and an image formed of a olephilic photosensitive polymer which is attached to the silicone and which has a surface layer of an oleophilic ink.

9. The structure of claim 8 wherein the abhesive silicone elastomer is formed of a polymer haing a diemthylpolysiloxane backbone.

10. The structure of claim 8 wherein the surface layer is formed of poly[1-($\beta$-oxyethyl-4'-sulfonylazido-carbanilate)-carbonyl-2-hydroxycarbonyl-3-methoxycarbonyl-4-tetramethylene].

* * * * *

UNITED STATES PATENT AND TRADEMARK OFFICE
CERTIFICATE OF CORRECTION

PATENT NO. : 4,055,424
DATED : October 25, 1977
INVENTOR(S) : Joseph Yung-Chang Chu and Richard Louis Schank It is certified that error appears in the above-identified patent and that said Letters Patent are hereby corrected as shown below:

Column 4, line 24, "4'-sulfonylzido" should be --4'-sulfonylazido--.
Column 4, line 41, after "area" insert a comma --,--.
Column 4, line 57, "olephilic" should be --oleophilic--.
Column 4, line 61, "haing" should be --having--.
Column 4, line 61, "diem-" should be --dime- --.

Signed and Sealed this

Twenty-eighth Day of February 1978

[SEAL]

Attest:

RUTH C. MASON
Attesting Officer

LUTRELLE F. PARKER
Acting Commissioner of Patents and Trademarks